US009619588B1

(12) United States Patent
Lyons

(10) Patent No.: US 9,619,588 B1
(45) Date of Patent: Apr. 11, 2017

(54) DETECTING AND DISPLAYING CUMULATIVE LOSSY TRANSFORMATION

(71) Applicant: CA, Inc., New York, NY (US)

(72) Inventor: Mike Arnold Lyons, Vancouver (CA)

(73) Assignee: CA, Inc., New York, NY (US)

(*) Notice: Subject to any disclaimer, the term of this patent is extended or adjusted under 35 U.S.C. 154(b) by 0 days.

(21) Appl. No.: 15/087,584

(22) Filed: Mar. 31, 2016

(51) Int. Cl.
H03M 7/00 (2006.01)
G06F 17/50 (2006.01)

(52) U.S. Cl.
CPC .............. G06F 17/50 (2013.01); H03M 7/00 (2013.01)

(58) Field of Classification Search
CPC .......... G06F 17/50; H03M 5/00; H03M 7/00; H03M 13/1515
USPC ..................................................... 341/50, 51
See application file for complete search history.

(56) References Cited

U.S. PATENT DOCUMENTS

| 5,455,928 A | 10/1995 | Herlitz | |
|---|---|---|---|
| 6,314,469 B1 | 11/2001 | Tan et al. | |
| 6,404,814 B1 * | 6/2002 | Apostolopoulos | H04N 19/40 375/240.08 |
| 7,848,358 B2 * | 12/2010 | LaDue | G01D 4/004 370/493 |
| 8,180,915 B2 * | 5/2012 | Zhao | H04N 21/2662 375/240.12 |
| 8,689,089 B2 * | 4/2014 | Wang | H04L 1/0041 714/776 |
| 2004/0215647 A1 | 10/2004 | Farn et al. | |
| 2008/0313535 A1 | 12/2008 | Storisteanu | |
| 2013/0009981 A1 * | 1/2013 | Kruglick | H04N 21/2343 345/619 |
| 2014/0114639 A1 | 4/2014 | Yanoo | |
| 2015/0104153 A1 | 4/2015 | Braness et al. | |

OTHER PUBLICATIONS

Balmelli, "An Overview of the Systems Modeling Language for Products and Systems Development", Journal of Object Technology, vol. 6, No. 6, retrieved on Mar. 17, 2016 from http://www.jot.fm/issues/issue_2007_07/article5.pdf, Jul.-Aug. 2007, pp. 149-177.

* cited by examiner

Primary Examiner — Jean B Jeanglaude
(74) Attorney, Agent, or Firm — Gilliam IP PLLC

(57) ABSTRACT

Systems and techniques for representing data transformation loss in a system model that includes multiple nodes are disclosed. In an embodiment, an interface generator determines that a first node in a data path applies a data coding. In response, at least in part, to determining that a second node that is downstream from the first node applies a data transcoding, the interface generator determines a decoding stability factor that corresponds to a combined data transformation loss incurred by the data transcoding in combination with the data coding. The interface generator generates a display object having a display indicator that corresponds to the decoding stability factor.

20 Claims, 5 Drawing Sheets

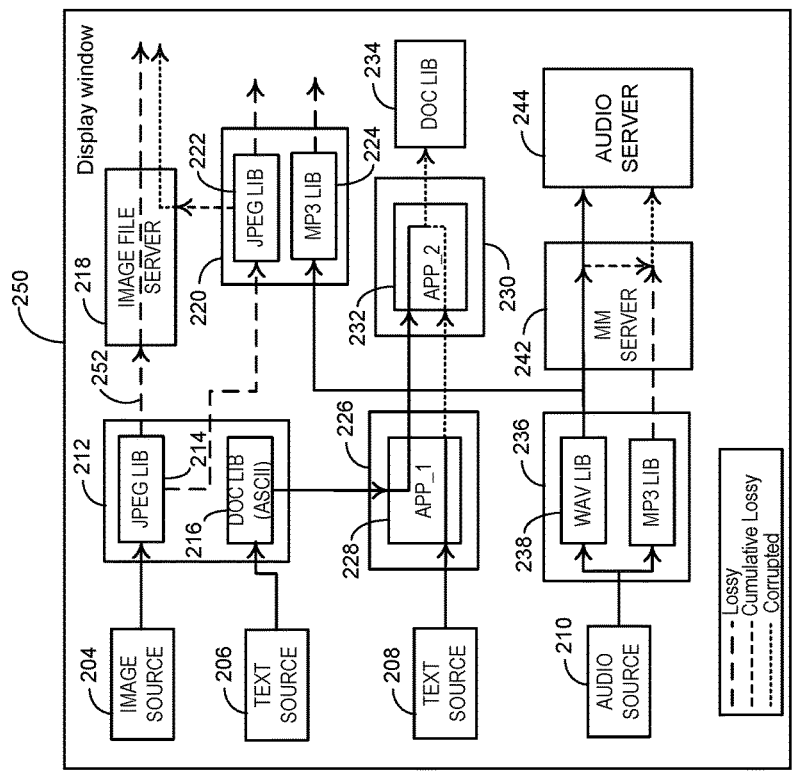
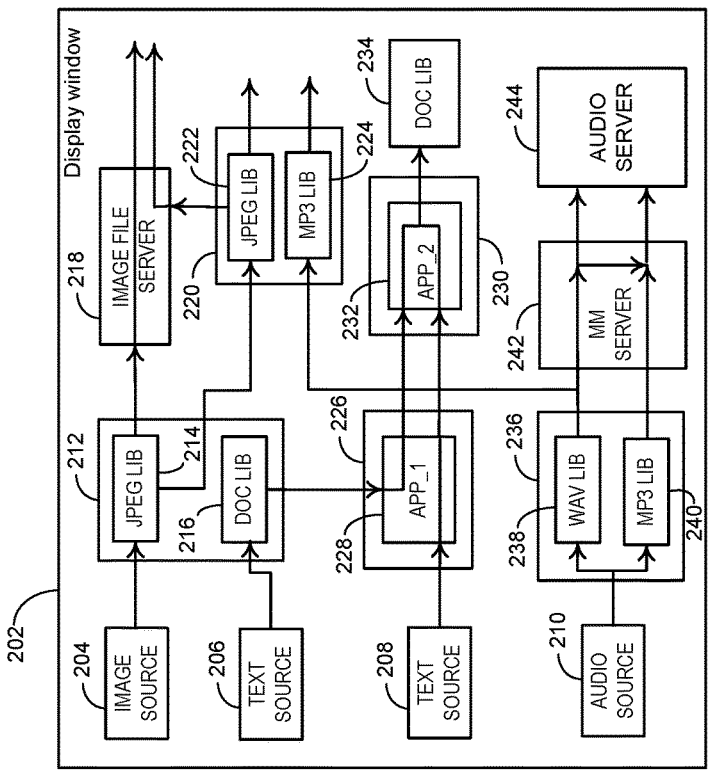
FIG. 2B
FIG. 2A

DETECTING AND DISPLAYING CUMULATIVE LOSSY TRANSFORMATION

BACKGROUND

The disclosure generally relates to the field of data path analysis, and more particularly to determining and mapping lossy data transformations among nodes in a system model.

Compatibility in data formatting and encoding is a significant issue in many processing and networking environments. Consistent, compatible messaging protocols enable reliable communication and interactive processing among different systems and components. Protocol adapters and bridges may be utilized to map between systems and components that utilize different communication protocols. In addition to communication protocol consistency, interconnected systems and components rely on mutually compatible data encoding formats. Fundamentally, a data encoding format determines how non-binary information such as image data, audio data, and text characters are encoded into a binary digital format that may be processed and exchanged between processing units such as operating systems, application programs, audio or video processors, etc.

Aside from differences in the non-binary constructs to be mapped, data encoding techniques may differ in terms of application. For example, some data encoding techniques may encode raw audio data into audio files suitable to be stored and played (decoded) using a format-compatible audio player/decoder. Analogous data encoding techniques are available for storing and processing display image data. Compression is another category of data encoding that is closely associated with many forms of audio, image, and video encoding. For example, MP3 is a commonly utilized audio compression standard for the transferring, storing, and playback of music. Another distinct form of data encoding is text encoding which is becoming a more complex issue with the proliferation of distributed, globalized computer and network systems that require integration of multi-lingual text encoders/decoders.

Encoded data loss (lossiness) is a factor in many digital-to-digital as well as almost all analog-to-digital data transformations. Some level of lossiness is intended by the design of some data encoding methods. For example, the MP3 audio encoding format implements a type of lossy data compression that reduces the amount of data required to represent an audio recording while maintaining enough information to enable an adequate representation of the uncompressed audio. A manner of encoded data loss may also occur incidental to some text character transformations. For example, Unicode provides a universally applicable set of codepoints for encoding text characters and symbols used by most human languages to enable accurate exchange of text files that may include elements of multilingual text. While Unicode itself provide a universally comprehensive character/symbol to codepoint mapping, other text encoding methods such as ASCII may not cover the same character range. Therefore, an ASCII transcoder that receives input Unicode encoded (e.g., UTF-8) character strings, may lose some character information, particularly in multilingual application context. Problems relating to lossiness may arise in some systems, such as systems comprised of newly integrated components one or more of which transform data in some manner resulting in file or other data objects containing mixed data encodings.

BRIEF DESCRIPTION OF THE DRAWINGS

Embodiments of the disclosure may be better understood by referencing the accompanying drawings.

FIG. 2A is a block diagram illustrating a multi-node system diagram that includes display objects that represent nodes and path links among the nodes in accordance with some embodiments;

FIG. 2B is a block diagram depicting the multi-node system diagram shown in FIG. 2A, and further including path links display indicators that correspond to detected decoding stability factors in accordance with some embodiments;

DESCRIPTION

The description that follows includes example systems, methods, techniques, and program flows that embody aspects of the disclosure. However, it is understood that this disclosure may be practiced without some of these specific details. In other instances, well-known instruction instances, protocols, structures and techniques have not been shown in detail in order not to obfuscate the description.

As utilized herein "transcoding" is a sub-set of "coding" with encompasses transcoding as well as encoding and re-encoding. Decoding stability may generally characterize whether and/or the extent to which encoded data may be decoded to reproduce or reconstruct original text characters in the case of text coding. Decoding stability may also or alternatively generally characterize whether and/or the extent to which encoded data may be decoded to reproduce or reconstruct a media representation (e.g., display of encoded image data) in the case of audio or image encoding. In some embodiments, decoding stability may characterize decode reconstruction precision for a combination of text and media data such as in a multimedia file. For either encoded text or media, the decoding stability may be determined in part by whether the encoder applies a lossy transformation. Whether by loss of binary information and/or misaligned character mappings, a decoding stability factor is a value or symbol generated and used by a system model generator to select display indicators for displayed objects within a system model.

While widely associated with audio, video, and image compression, lossy transformation or lossiness in the present disclosure refers to either text encoding and/or the media encoding transformations. In a media encoding context (e.g., encoding audio data), "lossy" or "lossy transformation" may be used to characterize encoding of incoming media data in which some portion of the incoming binary data is removed or otherwise lost. For example, compressing raw image data using an image compression format such as JPEG may be characterized as lossy if some of the incoming binary data is removed such as to save storage space. In a text encoding context (e.g., transcoding UTF-8 encoded characters to ASCII characters) "lossy" or "lossy transformation" may be used to characterize the re-encoding or transcoding of incoming text in which none of the incoming binary data is removed per the transcoding, but a mismatched text character mappings results in the inability of the transcoder to correctly identify and encode one or more of the incoming text characters.

Figure 1:
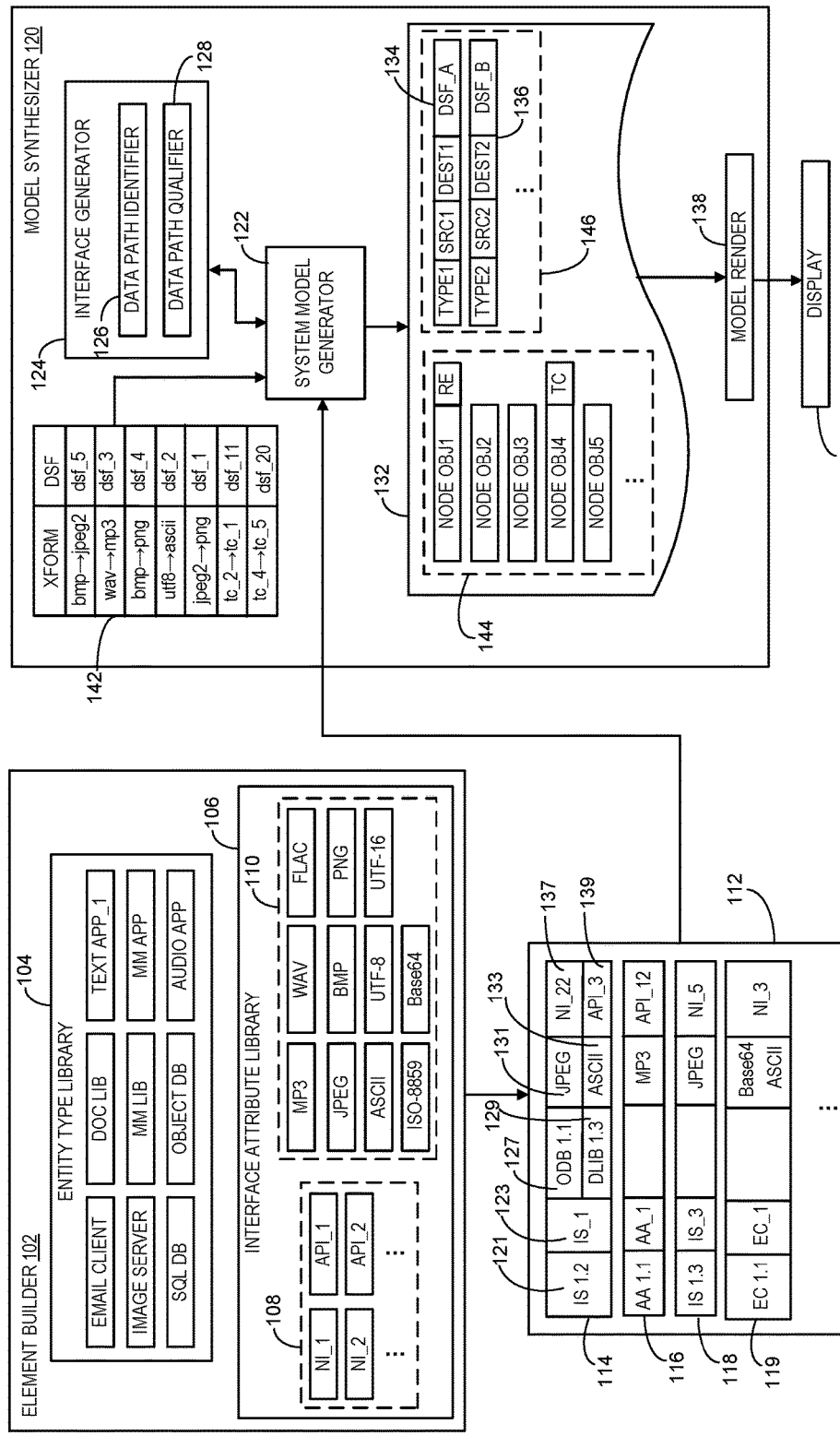
FIG. 1 is a block diagram depicting a system model build environment for generating and displaying cumulative lossy transform information associated with a diagrammed system model in accordance with some embodiments.

The embodiments depict and describe a system model generator for detecting and processing system model data associated with lossy transformations to generate visually displayable cumulative lossy transformation data. FIG. 1 is a block diagram depicting a system model build environment for generating and displaying cumulative lossy transform information associated with a diagrammed system model in accordance with some embodiments. The model build environment includes an element builder unit 102 that generates model files to be processed and rendered by a model synthesizer 120. Element builder 102 is configured, using any combination of coded software, firmware, and/or hardware, to generate model files such as a system model file 112 that includes element definition records 114, 116, 118, and 119.

In some embodiments, element builder 102 receives input such as from a user input interface (not depicted) that specifies or otherwise selects system model elements from within a node entity library 104 and an interface attribute library 106. Node entity library 104 includes a menu of prototype node entity objects that, within a system model and corresponding rendered system diagram, represent system entities such as applications, components, subsystems, etc. As shown in FIG. 1, node entity library 104 comprises objects that represent several distinct types of system entities such as an email client (EMAIL CLIENT), a document library (DOC LIBRARY), a multi-media library (MM LIBRARY), object database (OBJECT DB), a text application (TEXT APP_1), etc. Element builder 102 may receive a series of input selections that specify one or more of the node entity objects within node entity library 104 to be included in a particular system model that contains multiple interconnected and nested node entities.

Element builder 102 further receives input that specifies or otherwise selects prototype element objects from interface attribute library 106. As shown in the depicted embodiment, interface attribute library 106 comprises a selectable menu of device/program interface objects 108 and a selectable menu of data format type objects 110. The interface objects 108 include network interface objects (NI_1, NI_2, etc.) and application program interface objects (API_1, API_2, etc.) Typically, the prototype object selections directed to interface attribute library 106 specify corresponding node entity objects that are or will be selected from node entity library 104. For example, an interface object selection input may specify a network interface for a server node entity object selected from node entity library 104. Another interface object selection may specify a particular API for an application program node entity object selected from node entity library 104.

Data format objects 110 includes objects that each represent a particular format in which a data file or other data object may be encoded. As shown in FIG. 1, format objects 110 include audio data encoding formats such as MP3, WAV, and FLAC. Format objects 110 further include image data encoding formats such as JPEG, BMP, and PNG. The audio and image encoding formats are frequently utilized by system components and applications to compress raw audio and image data and/or further compress encoded audio and image data files. A key characteristic in many audio and image encoding format is whether the format is lossless or lossy. Lossless formats are utilized for applications in which all or substantially all previously encoded data is preserved such as may be accomplished with a lossless compression algorithm. WAV is an example lossless audio file format that applies linear pulse code modulation formatting. Lossy formats are utilized for applications in which some of the previously encoded data can or must be removed for various data handling objectives such as storage space conservation, limited network bandwidth to transmit the data, etc. For example, the JPEG and MP3 formats are media data formats (image and audio) that apply respective compression formats that removes some binary data. In some systems, media data such as audio, image, and video may be initially encoded in one format (e.g., WAV) incurring little or no loss of data and at some point in a data path may be transcoded into another format (e.g., MP3) in which significant data is lost.

Another category of data formats are formats for text characters (text formats) such as text characters generated by many application programs such as email clients, word processors, source code editors, etc. The depicted data format objects 110 includes several text encoding formats such as ASCII and UTF-8 and a binary transfer encoding format, Base64. As utilized herein, the notion of lossiness for text encoded data is distinct from the typically compression-oriented loss of binary data incurred in lossy audio or image data formats. For text encoding, lossiness may result from different character lexeme mapping. The lexeme character mapping used by ASCII, for example, includes 128 code points. In contrast, the Unicode character space (implemented for example by UTF-8) includes 1,112,064 character "code points" in its code space. Therefore, it is possible to lose data, not by removal of portions of input binary, but by the inability of, for example an ASCII encoder to transcode UTF-8 encoded characters that do not have corresponding code points in ASCII. As with the selection of interface objects from device/program interface objects 108, the selection of objects from data format objects 110 may typically be associated with a system entity and/or one of the interface objects. For example, an input request that selects the UTF-8 format object may specify or be otherwise associated with a selection of an email client entity object.

Element builder 102 is configured, using any combination of coded software, firmware, and/or hardware, to generate element definition records such as records 114, 116, 118, and 119 that each associate one or more node entities objects, one or more device/program interface objects, and one or more of the data formats. For example, element definition record 114 includes a name field 121 containing an entity name entry IS 1.2, and an entity type field containing an entity type entry IS_1. The entity type entry specifies a category (e.g., type 1 imager server) of the node entity that was selected from node entity library 104. The entity name entry specifies a node entity instance within a system model that is described by the records within model file 112 (e.g., second instance of an image server within system model 1). Record 114 further includes node sub-entity fields 127 and 129 that contain sub-entity names ODB 1.1 and DLIB 1.3, respectively. As utilized herein a "sub-entity" is a system entity node that is instantiated by element builder 102 within another entity. The element definition record 114 therefore associates an object database instance (ODB 1.1) and a document library instance (DLIB 1.3) as being incorporated within the image server instance 1.2.

In addition to assigning hierarchical associations among system node entities, the element definition records associate device/program interfaces and data formats with respective node entities. For example, element definition record 114 includes a format field 131 that include an entry, JPEG, which associates the image data format JPEG with the ODB 1.1 entry within field 127. Record 114 further includes a format field 133 that includes an entry, ASCII, which associates the text data format ASCII with the DLIB 1.3 entry within field 129. Other records such as records 116, 118, and 119 are similarly configured by element builder 102 to associate system node entities with other system nodes and also to establish interpretable associations between and among the entities by virtue of being associated with the same network interface identifiers and/or APIs.

Once the element definition records have been generated, model file 112 is received as input by model synthesizer 120 which generates objects and other data structures that map or otherwise functionally associate system nodes defined by and within each of the element definition records. In the depicted embodiment, model synthesizer 120 comprises a system model generator 122 and an interface generator 124. System model generator 122 and interface generator 124 are configured, using any combination of coded software, firmware, and/or hardware, to process each of the records within model file 112 to generate a set of node objects 144 and a set of path links objects 146 from the element definition records. Model synthesizer 120 further includes a data transform table 142 having entries that each include a transform field (XFORM) and a decoding stability factor field (DSF). As explained in further detail below, components within interface generator 124 may utilized determined code transformations (e.g., ASCII to UTF-8) to index into table 142 and obtain corresponding decoding stability factor values that may then be utilized to set or modify display indicators for path link objects.

System model generator 122 first receives and parses each of the element definition records to identify the constituent node entities and the interfaces described in each. System model generator 122 also determines associations between node entities and interfaces and between data formats and the constituent node entities. In this manner system model generator 122 identifies the node entities, interfaces, data formats, and the associations between and among node entities, interface entities, and data formats for all of the element definitions records within model file 112.

Next, system model generator 122 and interface generator 124 process the identified node and interface entities to generate a set of node objects 144 within an object file 132. More specifically, a data path identifier 126 within interface generator 124 processes the identified node entity and interface entity information determined by system model generator 122 to identify end-to-end data paths with the system model. As utilized herein, a "data path" constitutes the node entities (nodes) and inter-node path links connecting node entity interfaces that process and carry data, such as character text or multimedia data, in a particular data format such as ASCII or JPEG. The node entities and data paths are represented by node objects 144 and path link objects 146 within object file 132 and may be rendered by model render component 138 to display a system model diagram within a display window of a display device 140.

For example, and with reference to FIG. 2A in conjunction with FIG. 1, a display window 202 is depicted as containing a multi-node system diagram that includes display objects that represent nodes and data paths among the nodes in accordance with some embodiments. As shown, the system diagram within display window 202 includes source node entities including an image source node 204, a text source node 206, a text source node 208, and an audio source node 210. The source entities represent the origin nodes for each of multiple respective data paths that are depicted directionally with arrows pointing in the data path flow direction. Image source node 204 sources a data path that flows to a next downstream node, which in the depicted embodiment, is a JPEG library node 212 which is instantiated within From JPEG library node 212, the data path branches to an image file server node 218 and a JPEG library 222 that is instantiated within a multimedia library node 220.

Text source node 206 sources a text data path that flows to a downstream document library node 216 that is instantiated within server node 212. From document library node 216, the data path continues to an application node 228 that is instantiated within a server 226. The data path continues with a series of displayed path links connecting application node 228 to application node 232 and application node 232 to a document library node 234. Text source node 208 sources a text data path that flows to application node 228 and continues with a path link that converges within application node 232 with the data path sourced from text source 206. An additional path link connects the converged path links within application node 232 to downstream document library node 234. Audio source node 210 sources an audio data path to downstream server node 236 within which it branches to a WAV library node 238 and an MP3 library node 240. MP3 library node 240 sources an MP3 formatted data path that flows via a displayed path link object to a multimedia server node 242. WAV library node 238 sources a WAV formatted data path that flows to multimedia server node 242. As depicted, the WAV data path flows to an audio server node 244 and also converges within a component within multimedia server node with the MP3 data flow and continues as represented by the path link from multimedia server node 242 to audio server node 244.

As depicted in FIG. 2A, the system diagram within display window 202 includes heterogeneous data processing nodes, resulting in different data formats for image and audio media as well as for text applications. Modeling systems using in this manner, while effective for displaying inter-node communication and data paths may be insufficient to detect problematic data transformations that may occur in a same data path that may result in degradation or corruption of the data. In some embodiments, system model generator 122 and data path identifier 126 may be configured to determine which path links in a given data path may be subject to decoding instability. The decoding instability may be represented as a decoding stability factor that may be determined by data path identifier 126 and a data path qualifier 128 within interface generator 124. A decoding stability factor may be a numeric or other quantitative value or may be a qualitative value determined by model synthesizer 120 to set or adjust one or more corresponding path link visual indicators.

As explained with continued reference to FIG. 1 in conjunction with FIG. 2B, data path identifier 126 may be configured to generate node objects 144 and path link objects 146 while identifying and flagging the node objects 144. The node objects 144 may be flagged with data that may be utilized by data path qualifier 128 to determine decoding stability factor values that may be utilized to select and insert corresponding display indicators in the path link objects. Data path identifier 126 processes the interface and data format information for each of the node entities to identify the data paths. For example, data path identifier 126 reads node entity information and corresponding interface information to determine communication and data paths between and among the nodes. Data path identifier 126 may further identify node entities within each of the data paths as being encoding or transcoding node. In an embodiment, data path identifier 126 determines whether or not a node entity is an encoding or transcoding node with respect to each of the one or more data paths received by the node. For instance, data path identifier 126 may associate multiple nodes as included within a data path based on interface and data formatting information included in the element definition records. In addition, or alternatively, data path identifier 126 may determine data paths based on express data path definitions (not depicted) provided within model file 112.

Having identified the data paths, data path identifier 126 processes each node in a given path to determine the node's role as either an encoder/transcoder or as a format user that decodes/re-encode using the same format as the received data. For a given node within a given data path, data path identifier 126 may read the corresponding data path node objects to determine whether the node is an original encoding source of the text or media data for the path. In response to determining that the node is an original data source encoder, the data path identifier 126 may determine an associated decoding stability factor for the output of the node based on an input data format and the encoding format used by the node. For instance, in response to determining that the node encodes uncompressed WAV data into MP3 format, the data path identifier 126 may read data transform table 142 to locate a wav→mp3 indexed entry based on the original WAV format and on the MP3 encoding format. Having located the entry, data path identifier 126 determines a decoding stability factor value dsf_3 which represents the binary lossiness incurred by the WAV to MP3 encoding.

If the node is not a data encoding source, data path identifier 126 further determines whether the node is or includes a transcoder that transcodes incoming data path data into another format. In some embodiments, data path identifier may access the node objects to identify an immediate upstream node and compare the upstream node's data format with the node's data format. If the upstream node's data format differs from the node's output data format, data path identifier 126 identifies the node as a transcoder node. Having identified the node as a transcoder, data path identifier 126 may access data transform table 142 to identify a corresponding decoding stability factor for the node. In some embodiments, data path identifier 126 may insert a flag within the corresponding one of node objects 144 that designates and may be utilized by data path qualifier 128 to identify the node as a transcoder node. Data path identifier 126 may further generate one of path link objects 146 that specifies a link type, a source interface ID, and a destination interface ID. For example, path link object 134 includes a link type, TYPE1, which may indicate a path link category such as a network interface type. Path link object 134 further includes a source interface ID, SRC1, which may specify an identifier of an output interface from which the data in the data path is output from the node. Path link object 134 further includes a destination interface ID, DEST1, which may specify an identifier of an input interface for an immediate downstream node.

The path link object generated by data path identifier 126 may further include a display indicator that corresponds to the determined decoding stability factor for the node. For example, path link object 134 includes display indicator DSF_A which corresponds to a decoding stability factor value determined from data transform table 142. The display indicator may be read and interpreted by model render unit 138 to display or alter a display of the corresponding path link in a manner that corresponds to data loss or corruption associated with the decoding stability factor. For example, and with reference to FIG. 2B, a path link object 252 is depicted that may be generated in the forgoing manner. As shown, path link object 252 is rendered to visually display a lossy transcoding based on the depicted path link display indictor legend.

In some embodiments, data path qualifier 128 may generate or modify one or more of path link objects 146 based on determined cumulative or otherwise combined data transformation loss. In an embodiment, data path qualifier 128 reads node objects 144 and path link objects 146 to identify the data paths, each comprising one or more of path link objects 146. For each of the identified data paths, data path qualifier 128 determines the direction of flow between nodes such as depicted by arrows in the rendered system diagrams in FIGS. 2A and 2B. In this manner, data path qualifier 128 can determine the relative upstream/downstream disposition of each of the nodes within a data path.

For each data path, data path qualifier 128 identifies a source data node. For example, image source node 204 is the source data node for the data path that includes path link object 252 in FIG. 2B. Data path qualifier 128 then identifies each downstream node in the data path that is a transcoder node. For example, data path qualifier 128 identifies MP3 library node 240 as a transcoder node in response to determining that the input data format (WAV) is different that the output data format (MP3) as indicated by the corresponding one of node objects 144. Alternatively, data path qualifier 128 may identify a transcoder node based on a flag asserted within the corresponding node object my data path identifier 126. For example, among node objects 144 is a NODE OBJ4 that includes a transcoder flag, TC.

Having identified the downstream transcoder nodes within a data path, data path qualifier 128 processes the each of the corresponding node objects to determine combined data transformation loss at various points within the data path. For each transcoder node, data path qualifier 128 identifies the coding (encoding or transcoding) format applied by an upstream encoder or transcoder node. Data path qualifier 128 may also determine the data format of the data that is input to the upstream encoder/transcoder node. Data path qualifier 128 may located an indexed entry within data transform table 142 based on the identified data format and determined encoding/transcoding format. For example, in response to identifying BMP as the input data format and JPEG2 as the transcoded, output data format, data path qualifier 128 may select the entry indexed as bmp→jpeg2 within data transform table 142, enabling data path qualifier 128 to obtain the corresponding decoding stability factor value, dsf_5. Data path qualifier 128 further determines the transcode format of transcoder node. Continuing with the example in which the upstream transcoder converts BMP data to JPEG2 data, data path qualifier may determine that the node transcodes data from JPEG2 to PNG.

Data path qualifier 128 may utilize the determined transcoding format to locate the entry within table 142 indexed as jpeg→png to obtain the associated decoding stability factor value of dsf_1. Data path qualifier 128 may then compute or otherwise determine a decoding stability factor value that accounts for and combines the potential data loss at the upstream transcoder, data loss at the transcoder node (downstream), and the potential combined effect. Continuing with the example, data path qualifier 128 may determine the combined data transformation loss by adding the upstream individual loss value, dsf_5 with the downstream individual loss value, dsf_1. In an alternate embodiment, data path qualifier 128 may computer or otherwise determine the combined data transformation loss as encompassing a combined transformation effect. Continuing with the example, data path qualifier 128 may utilize the source data format (i.e., format of data input to the upstream transcoder) in combination with the format of the downstream transcoder output data to determine a third decoding stability factor value. Namely, data path qualifier 128 accesses the table entry indexed as bmp→png based on the upstream transcoder input format (BMP) and the downstream transcoder output (PNG) to obtain decoding stability factor value dsf_4. In an embodiment, the "combined factor" decoding stability factor value may be added to the total decoding stability value.

Data path qualifier 128 processes each of the transcoder nodes within each of the identified data paths to determine decoding stability factors for the output path links for each. Data path qualifier 128, individually or in combination with other components within system model generator 122, may then associate the decoding stability factors of respective ones of the path link objects 146. In the depicted embodiment, path link objects 134 and 136 may be rendered by model render unit 138 to display a visual path link indicator, such as within display window 250 in FIG. 2B. Path link objects 134 and 136 include display indicator objects, DSF_A and DSF_B, respectively, which correspond to a respective decoding stability factor value. For example, DSF_A may be rendered to visually represent a path link that has been moderately degraded by a single lossy compression and therefore corresponds to the "Lossy" line indicator (long dashed line) within the legend in FIG. 2B. DSF_B may be rendered to visually represent a path link that has been degraded by multiple data transformations and therefore corresponds to the "Cumulative Lossy" line indicator (short dashed line) within the legend.

Figure 3:
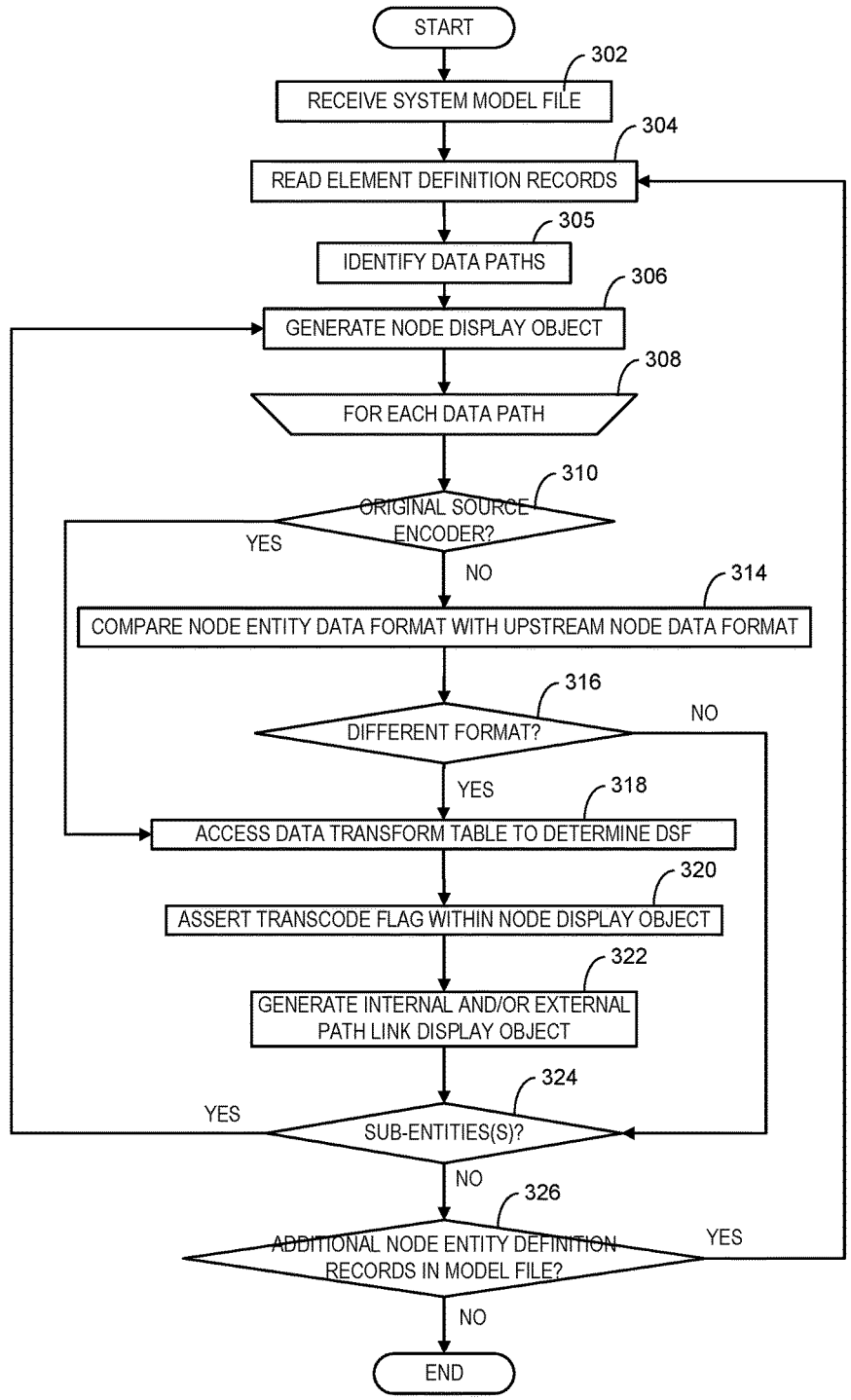
FIG. 3 is a flow diagram illustrating operations and functions performed by a system model generator to identify transcoding paths for a multi-node system model in accordance with some embodiments.

FIG. 3 is a flow diagram illustrating operations and functions performed by a system model generator to identify data coding and transcoding paths for a multi-node system model in accordance with some embodiments. The operations and functions depicted in FIG. 3 may be performed by one or more of the components such as the system model generator and interface generator depicted in FIG. 1. The process begins as shown at block 302 with an interface generator receiving a system model file that may include multiple element definition records and/or other data constructs that describe node entities and interface entities that comprise a system being modeled. For example, the element definition records may each specify a top-level node entity into which one or more other node entities are incorporated. The element definition records may be configured to associate note entities with respective interface entities and also to associate the node and/or interface entities with respective data formats.

The interface generator may process the element definition record information to identify path links and associations between and among path links that constitute end-to-end data paths and also to generate node objects and interface object. At block 304 the interface generator read the content of the element definition records to determine node-specific and interface-specific data path connectivity, direction, and data format information. Based on the element definition record information and/or on information from node and path link objects generated therefrom, the interface generator identifies the data paths in the system (block 305). Beginning at block 306, the interface generator begins a process of generating and modifying node objects with respect to each data path that each node object is included in. At block 306, the interface generator generates a node display object and determines, for each data path whether the corresponding node entity is included in (block 308), whether the node entity is an encoding format source (block 310). If so, control passes to block 318 with the interface generator reading or otherwise access a data transform table such as that depicted in FIG. 1 to determine a decoding stability factor for the node. For instance, the interface generator may determine the decoding stability factor by identifying the input data format (e.g., data format of text document library) and output data format (format that the data is encoded/transcoded into). The interface generator may utilize the output data format in combination with the input data format as an index to locate a corresponding decoding stability factor value.

If at block 310, the interface generator determines that the node entity is not an encoding format source, control passes to block 314 with the interface generator comparing a data format associated with the node entity with a data format of an immediate upstream node entity. For example, the interface generator may compare format identifiers included within the element definition records and/or the node objects. If the formats are determined to be the same or otherwise compatible without translation, the node entity is identified as a non-transcoder node and control passes to block 324. In response to determining a difference between the data formats, the interface generator identifies the node entity as a transcoder node and, at block 318, obtains a corresponding decoding stability factor from the data transform table. In an embodiment, the interface generator may utilize the upstream node format in combination with a data format for the node entity to locate the decoding stability factor within the table.

In response to or otherwise based on identifying the node entity as a transcoder node, the interface generator asserts a transcode flag within the node object. The node object generation and processing is repeated for any node entities (sub-entities) that, based on an element definition record, in incorporated within the node entity. In response to the interface generator determining at block 324, that all sub-entities have been processed, the interface generator determines whether all element definition records have been processed (block 326). The node object generation and processing is repeated for other element definition records with control returning to block 306 until all records have been processed and the process ends.

Figure 4:
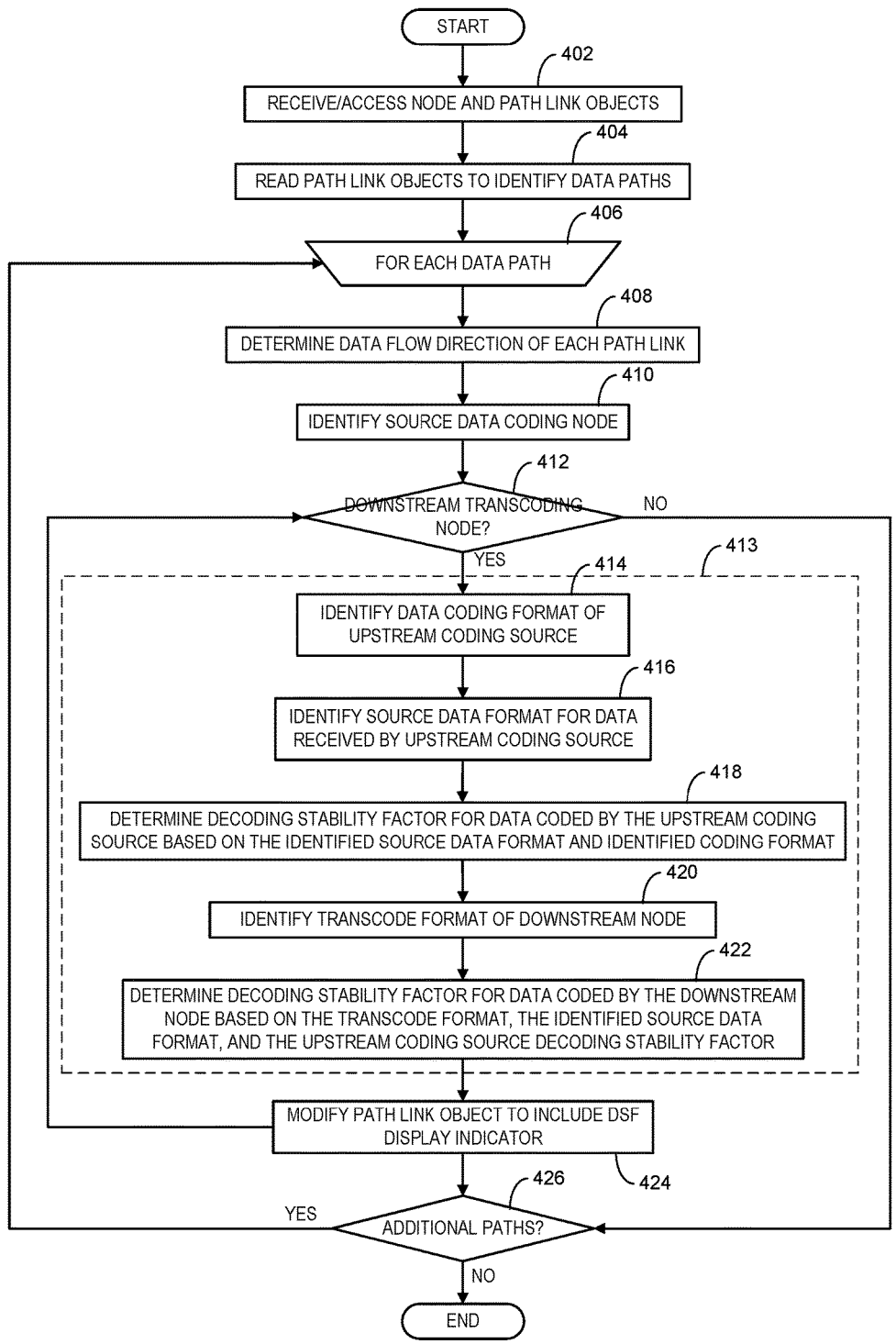
FIG. 4 is a flow diagram depicting operations and functions performed by a system model generator for determining cumulative or otherwise combined data transformation loss in accordance with some embodiments.

FIG. 4 is a flow diagram depicting operations and functions performed by a system model generator for determining, categorizing, and displaying cumulative or otherwise combined data transformation loss in accordance with some embodiments. The operations and functions depicted in FIG. 4 may be performed by various model generator components such as the system model generator, the data path identifier, and the data path qualifier depicted in FIG. 1. The process begins as shown at block 402 with a data path qualifier receiving and reading node objects and path link objects such as those described with reference to FIG. 1. The data path qualifier reads the path links to identify the data paths within the system (block 404). For example, the data path qualifier may identify the data paths using interface information including interface IDs and data format IDs.

The data path qualifier executes a processing sequence for each identified data path (block 406) beginning with determining the data flow direction of each of the constituent path links (block 408). Determining path link data flow direction enables components such as the data path qualifier to relative upstream/downstream disposition of each node in a data path with respect to the other data path nodes. At block

410, the data path qualifier identifies the source node for the data flow which may be a node that, for example, encodes raw data. At block 412, the data path qualifier determines whether the data path includes a downstream transcoding node. In response to determining that no transcoding occurs past the identified source node, control passes to block 426 with the data path qualifier determining whether all data paths have been processed.

In response to identifying or otherwise determining the existence of a downstream transcoder node, the data path qualifier commences a process within superblock 413 to determine a combined data transformation loss. Namely, control passes to block 414 with the data path qualifier identifying a data coding format of a coding entity (i.e., a transcoder or encoder node) that is upstream (not necessarily immediately or direct upstream) in the data path with respect to the identified/detected downstream transcoder. At block 416, the data path qualifier identifies the data format of data that is received and transcoded by the upstream coding entity. At block 418, the data path qualifier determines a decoding stability factor for the upstream coding entity based on the identified data coding format and on the identified data format of data received by the upstream coding entity. At block 420, the data path qualifier identifies the transcode format of the downstream transcoder node. In an embodiment, the transcode format specifies both the input data format and the transcoded data format. At block 422, the data path qualifier determines a decoding stability factor for data transcoded by the downstream transcoder based on the transcode format of the downstream transcoder, the identified data format of data received by the upstream coding entity, and on the decoding stability factor determined at block 418. At block 424, the data path qualifier may utilize the decoding stability factor determined at block 422 to modify a path link object that represents an output path link from the downstream transcoder node. For example, the data path qualifier may select or modify a display indicator object within the path link object that is associated with the determined decoding stability factor. As depicted at block 426, control returns to block 406 until all data paths within the system model and the process ends.

Variations

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality provided as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 5:
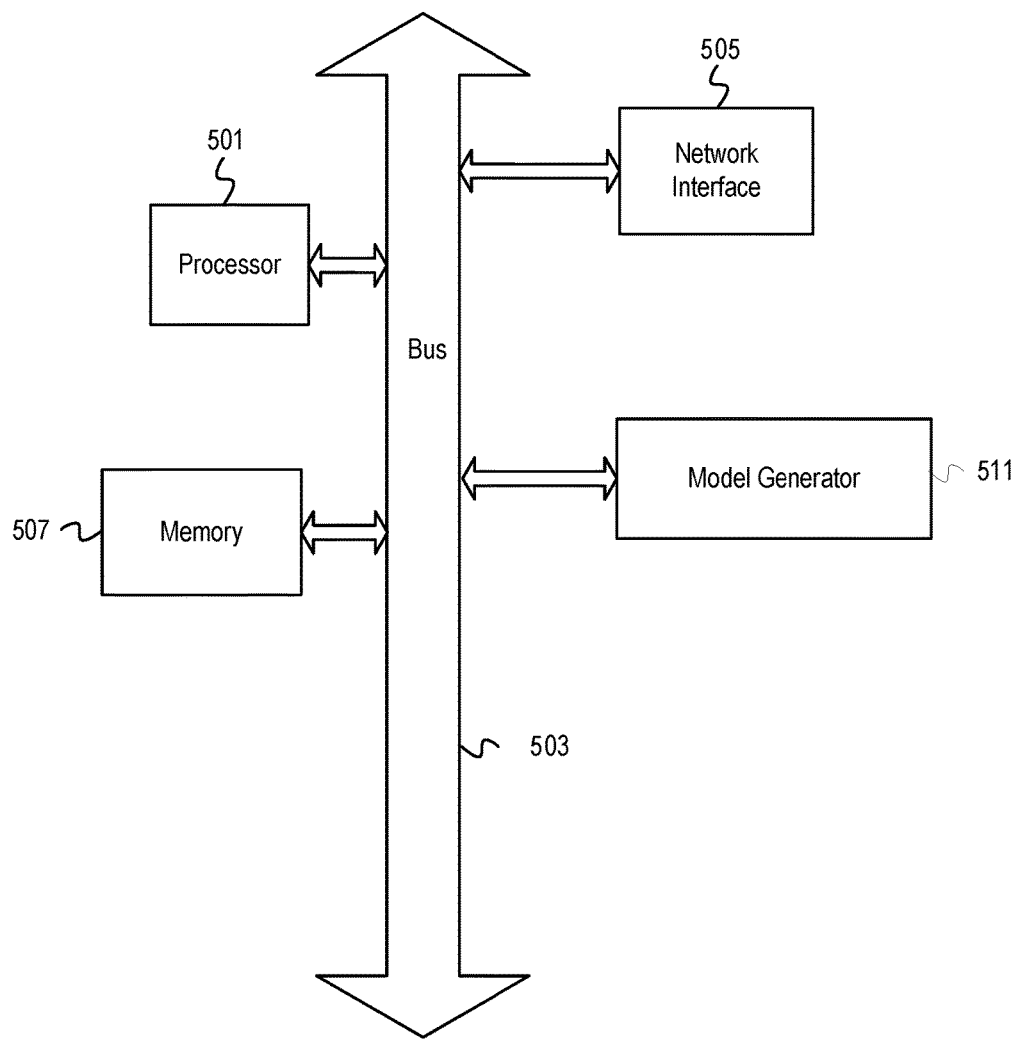
FIG. 5 is a block diagram depicting an example computer system that includes a system model generator in accordance with some embodiments.

FIG. 5 depicts an example computer system that implements system model generation, analysis, and display in accordance with an embodiment. The computer system includes a processor unit 501 (possibly including multiple processors, multiple cores, multiple nodes, and/or implementing multi-threading, etc.). The computer system includes memory 507. The memory 507 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 503 (e.g., PCI, ISA, PCI-Express, HyperTransport® bus, InfiniBand® bus, NuBus, etc.) and a network interface 505 (e.g., a Fiber Channel interface, an Ethernet interface, an internet small computer system interface, SONET interface, wireless interface, etc.). The system also includes a system model generator 511. The system model generator 511 provides program structures for generating node objects corresponding to node entities and path link objects corresponding to interfaces and data paths between or within node entities. The system model generator 511 further provides program structures for determining combined data transformation loss and modifying the path link objects to display corresponding indicators.

Any one of the previously described functionalities may be partially (or entirely) implemented in hardware and/or on the processor unit 501. For example, the functionality may be implemented with an application specific integrated circuit, in logic implemented in the processor unit 501, in a co-processor on a peripheral device or card, etc. Further, realizations may include fewer or additional components not illustrated in FIG. 5 (e.g., video cards, audio cards, additional network interfaces, peripheral devices, etc.). The processor unit 501 and the network interface 505 are coupled to the bus 503. Although illustrated as being coupled to the bus 503, the memory 507 may be coupled to the processor unit 501.

While the aspects of the disclosure are described with reference to various implementations and exploitations, it will be understood that these aspects are illustrative and that the scope of the claims is not limited to them. In general, techniques for an object storage backed file system that efficiently manipulates namespace as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality shown as separate components in the example configurations may be implemented as a combined structure or component. Similarly, structures and functionality shown as a single component may be implemented as separate components. These and other variations, modifications, additions, and improvements may fall within the scope of the disclosure.

What is claimed is:

1. A method for representing data transformation loss in a system model that includes multiple nodes, said method comprising:
   determining that a first node in a data path applies a data coding;
   determining that a second node, downstream from the first node in the data path, applies a data transcoding;
   in response, at least in part, to determining that the second node applies the data transcoding, determining a decoding stability factor that corresponds to a combined data transformation loss incurred by the data transcoding in combination with the data coding; and
   generating a display object having a display indicator that corresponds to the decoding stability factor.

2. The method of claim 1, wherein said generating a display object comprises generating a path link object that, when rendered by a display device, visually connects the second node to a third node that is downstream from the second node in the data path.

3. The method of claim 1, wherein said determining a decoding stability factor comprises:
   determining the combined data transformation loss by, identifying the data coding;
   identifying a source data format for data received by the first node; and
   determining a first decoding stability factor for data coded by the first node based on the data coding and the source data format.

4. The method of claim 3, wherein said determining the combined data transformation loss further comprises:
   identifying the data transcoding; and
   determining a second decoding stability factor for data transcoded by the second node based on the data transcoding, the source data format, and the first decoding stability factor.

5. The method of claim 4, wherein said generating a display object comprises generating the display object having a display indicator that corresponds to the second decoding stability factor.

6. The method of claim 1, further comprising:
   determining whether the data coding entails a lossy transformation; and
   in response, at least in part, to determining that the data coding entails a lossy transformation, determining whether a downstream node in the data path applies a lossy transformation.

7. The method of claim 1, wherein the display object comprises a first display object, said method further comprising:
   in response, at least in part, to determining that the data coding entails a lossy transformation, generating a second display object having a display indicator that corresponds to a data transformation loss incurred by the lossy transformation.

8. One or non-transitory more machine-readable storage media having program code for representing data transformation loss in a system model that includes multiple nodes stored therein, the program code to:
   determine that a first node in a data path applies a data coding;
   determine that a second node, downstream from the first node in the data path, applies a data transcoding;
   in response, at least in part, to determining that the second node applies the data transcoding, determine a decoding stability factor that corresponds to a combined data transformation loss incurred by the data transcoding in combination with the data coding; and
   generate a display object having a display indicator that corresponds to the decoding stability factor.

9. The machine-readable storage media of claim 8, wherein the program code to generate a display object comprises program code to generate a path link object that, when rendered by a display device, visually connects the second node to a third node that is downstream from the second node in the data path.

10. The machine-readable storage media of claim 8, wherein the program code to determine a decoding stability factor comprises program code to:
  determine the combined data transformation loss by,
    identifying the data coding;
    identifying a source data format for data received by the first node; and
    determining a first decoding stability factor for data coded by the first node based on the data coding and the source data format.

11. The machine-readable storage media of claim 10, wherein the program code to determine the combined data transformation loss further comprises program code to:
  identify the data transcoding; and
  determine a second decoding stability factor for data transcoded by the second node based on the data transcoding, the source data format, and the first decoding stability factor.

12. The machine-readable storage media of claim 11, wherein the program code to generate a display object comprises program code to generate the display object having a display indicator that corresponds to the second decoding stability factor.

13. The machine-readable storage media of claim 8, wherein the program code comprises program code to:
  determine whether the data coding entails a lossy transformation; and
  in response, at least in part, to determining that the data coding entails a lossy transformation, determine whether a downstream node in the data path applies a lossy transformation.

14. The machine-readable storage media of claim 8, wherein the display object comprises a first display object, and wherein the program code comprises program code to:
  in response, at least in part, to determining that the data coding entails a lossy transformation, generate a second display object having a display indicator that corresponds to a data transformation loss incurred by the lossy transformation.

15. An apparatus comprising:
  a processor; and
  a machine-readable medium having program code executable by the processor to cause the apparatus to,
    determine that a first node in a data path applies a data coding;
    determine that a second node, downstream from the first node in the data path, applies a data transcoding;
    in response, at least in part, to determining that the second node applies the data transcoding, determine a decoding stability factor that corresponds to a combined data transformation loss incurred by the data transcoding in combination with the data coding; and
    generate a display object having a display indicator that corresponds to the decoding stability factor.

16. The apparatus of claim 15, wherein the program code to generate a display object comprises program code to generate a path link object that, when rendered by a display device, visually connects the second node to a third node that is downstream from the second node in the data path.

17. The apparatus of claim 15, wherein the program code comprises program code executable by the processor to cause the apparatus to:
  determine the combined data transformation loss by,
    identifying the data coding;
    identifying a source data format for data received by the first node; and
    determining a first decoding stability factor for data coded by the first node based on the data coding and the source data format.

18. The apparatus of claim 17, wherein the program code comprises program code executable by the processor to cause the apparatus to:
  identify the data transcoding; and
  determine a second decoding stability factor for data transcoded by the second node based on the data transcoding, the source data format, and the first decoding stability factor.

19. The apparatus of claim 18, wherein the program code comprises program code executable by the processor to cause the apparatus to generate the display object having a display indicator that corresponds to the second decoding stability factor.

20. The apparatus of claim 15, wherein the display object comprises a first display object, and wherein the program code comprises program code executable by the processor to cause the apparatus to:
  determine whether the data coding entails a lossy transformation; and
  in response, at least in part, to determining that the data coding entails a lossy transformation,
    determine whether a downstream node in the data path applies a lossy transformation; and
    generate a second display object having a display indicator that corresponds to a data transformation loss incurred by the lossy transformation.

* * * * *